United States Patent
Nishiguchi et al.

(10) Patent No.: US 12,449,731 B2
(45) Date of Patent: Oct. 21, 2025

(54) PHOTOSENSITIVE RESIN COMPOSITION, METHOD FOR PRODUCING RESIST PATTERN FILM, AND METHOD FOR PRODUCING PLATED FORMED PRODUCT

(71) Applicant: JSR CORPORATION, Tokyo (JP)

(72) Inventors: Naoki Nishiguchi, Tokyo (JP); Tomoyuki Matsumoto, Tokyo (JP); Akira Ishii, Tokyo (JP); Ayako Endo, Tokyo (JP)

(73) Assignee: JSR CORPORATION, Tokyo (JP)

( * ) Notice: Subject to any disclaimer, the term of this patent is extended or adjusted under 35 U.S.C. 154(b) by 742 days.

(21) Appl. No.: 17/298,750

(22) PCT Filed: Dec. 6, 2019

(86) PCT No.: PCT/JP2019/047827
§ 371 (c)(1),
(2) Date: Jun. 1, 2021

(87) PCT Pub. No.: WO2020/121967
PCT Pub. Date: Jun. 18, 2020

(65) Prior Publication Data
US 2022/0057714 A1    Feb. 24, 2022

(30) Foreign Application Priority Data
Dec. 12, 2018  (JP) .................. 2018-232868

(51) Int. Cl.
*G03F 7/039* (2006.01)
*G03F 7/004* (2006.01)
*G03F 7/32* (2006.01)

(52) U.S. Cl.
CPC .......... *G03F 7/0392* (2013.01); *G03F 7/0045* (2013.01); *G03F 7/322* (2013.01)

(58) Field of Classification Search
None
See application file for complete search history.

(56) References Cited

U.S. PATENT DOCUMENTS

2007/0059636 A1* 3/2007 Kuroki ............... G03F 7/033
430/270.1
2010/0316954 A1 12/2010 Koyama et al.
(Continued)

FOREIGN PATENT DOCUMENTS

JP   H06-83058 A    3/1994
JP   2000194127 A   7/2000
(Continued)

OTHER PUBLICATIONS

English Machine Translation of JP2014102285A (Year: 2014).*
(Continued)

*Primary Examiner* — Mark F. Huff
*Assistant Examiner* — Anna Malloy
(74) *Attorney, Agent, or Firm* — Element IP, PLC

(57) ABSTRACT

A photosensitive resin composition contains at least one compound selected from the group consisting of compound (C1) represented by formula (C1), compound (C2) represented by formula (C2), and a multimer of the compound (C2). Z each independently represents an oxygen atom or a sulfur atom. $R^{31}$ each independently represents a monovalent hydrocarbon group or a group obtained by substituting at least one hydrogen atom in the monovalent hydrocarbon group with a mercapto group, and at least one $R^{31}$ is a group obtained by substituting at least one hydrogen atom in the monovalent hydrocarbon group with a mercapto group when p is 1 and when p is an integer of 2 or more and all of Z is an oxygen atom. $R^{32}$ and $R^{33}$ each independently represent a divalent hydrocarbon group, and $R^{34}$ represents a glycoluril ring structure or an isocyanul ring structure.

(Continued)

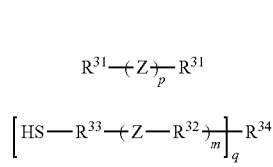

(C1)

(C2)

13 Claims, 1 Drawing Sheet

(56) References Cited

U.S. PATENT DOCUMENTS

| | | | | |
|---|---|---|---|---|
| 2012/0184101 | A1* | 7/2012 | Yasuda | G03F 7/0397 430/326 |
| 2015/0268553 | A1* | 9/2015 | Katayama | G03F 7/0045 430/285.1 |
| 2018/0009775 | A1* | 1/2018 | Tanaka | C07D 307/52 |
| 2019/0086806 | A1* | 3/2019 | Usui | G03F 7/11 |

FOREIGN PATENT DOCUMENTS

| | | | |
|---|---|---|---|
| JP | 2000199960 A | | 7/2000 |
| JP | 2000214587 A | | 8/2000 |
| JP | 2000267283 A | | 9/2000 |
| JP | 2002268223 A | | 9/2002 |
| JP | 2002341539 A | | 11/2002 |
| JP | 2003002925 A | | 1/2003 |
| JP | 2004083900 A | | 3/2004 |
| JP | 2004145048 A | | 5/2004 |
| JP | 2004317907 A | | 11/2004 |
| JP | 2004348106 A | | 12/2004 |
| JP | 2005133066 A | | 5/2005 |
| JP | 2005208366 A | | 8/2005 |
| JP | 2006330368 A | | 12/2006 |
| JP | 2009223294 A | | 10/2009 |
| JP | 2009276607 A | | 11/2009 |
| JP | 2010008972 A | | 1/2010 |
| JP | 2010138330 A | | 6/2010 |
| JP | 2010275555 A | | 12/2010 |
| JP | 2011029636 A | | 2/2011 |
| JP | 2013007846 A | | 1/2013 |
| JP | 2013101321 A | | 5/2013 |
| JP | 2014013381 A | | 1/2014 |
| JP | 2014029518 A | | 2/2014 |
| JP | 2014102285 A | * | 6/2014 |
| JP | 2014157252 A | | 8/2014 |
| JP | 2015059099 A | | 3/2015 |
| JP | 2015526752 A | | 9/2015 |
| JP | 2015214634 A | | 12/2015 |
| JP | 2016018075 A | | 2/2016 |
| JP | 2016061933 A | | 4/2016 |
| JP | 2016098350 A | | 5/2016 |
| JP | 2016099483 A | | 5/2016 |
| JP | 2016164134 A | | 9/2016 |
| JP | 2016164135 A | | 9/2016 |
| JP | 2016169174 A | | 9/2016 |
| JP | 2016210761 A | | 12/2016 |
| JP | 2017037320 A | | 2/2017 |
| JP | 2017044875 A | | 3/2017 |
| JP | 2017058421 A | | 3/2017 |
| JP | 2017102260 A | | 6/2017 |
| KR | 20130089589 A | * | 8/2013 |
| KR | 20140147847 A | * | 12/2014 |
| TW | 201348865 A | | 12/2013 |
| WO | WO-2009113228 A1 | | 9/2009 |
| WO | WO-2013157459 A1 | | 10/2013 |
| WO | WO-2017170696 A1 | * | 10/2017 .......... C08K 5/0025 |

OTHER PUBLICATIONS

English Machine Translation of KR20140147847A (Year: 2014).*
English Machine Translation of KR20130089589A (Year: 2013).*
International Search Report issued Feb. 18, 2020 in PCT/JP2019/047827 (with English translation), 7 pages.
Written Opinion issued Feb. 18, 2020 in PCT/JP2019/047827 (with English translation), 8 pages.
Office Action and Search Report issued Apr. 26, 2023 in Taiwanese Patent Application No. 108145381 (with English translation), 15 pages.
Office Action issued Feb. 28, 2023 in Japanese Patent Application No. 2020-560046 (with English translation), 7 pages.
Combined Taiwanese Office Action and Search Report issued Oct. 24, 2023 in Taiwanese Patent Application No. 112132565 (with English translation), 14 pages.
Office Action issued Apr. 1, 2024 in corresponding Korean Patent Application No. 10-2021-7017174 (with English translation), 10 pages.
Office Action issued Mar. 25, 2025, in corresponding Korean Patent Application No. 10-2024-7017033 (with English translation), 10 pages.

* cited by examiner

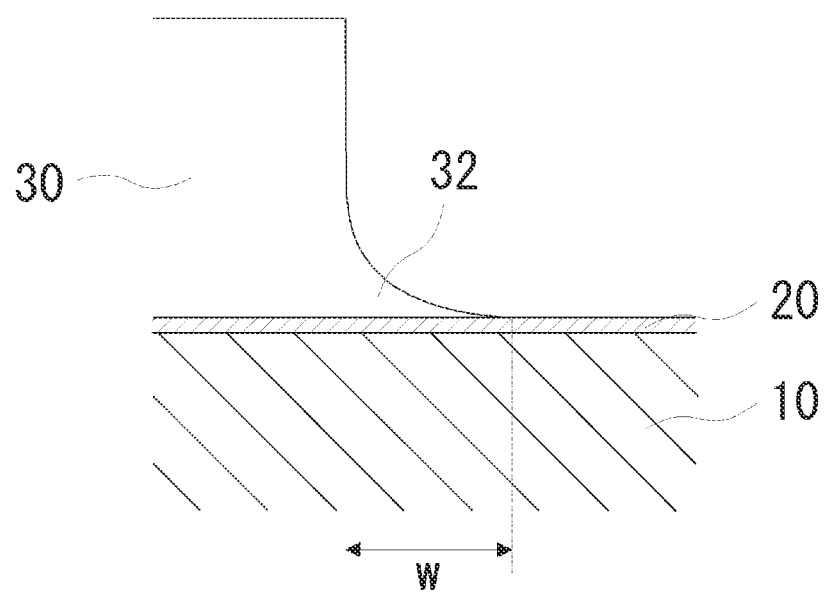

PHOTOSENSITIVE RESIN COMPOSITION, METHOD FOR PRODUCING RESIST PATTERN FILM, AND METHOD FOR PRODUCING PLATED FORMED PRODUCT

TECHNICAL FIELD

The present invention relates to a photosensitive resin composition, a method for producing a resist pattern film, and a method for producing a plated formed product.

BACKGROUND ART

To improve the performance of mobile devices such as smartphones and tablet terminals, semiconductor chips with different functions are packaged by using high-density packaging technology such as FO-WLP (Fan-Out Wafer Level Package), FO-PLP (Fan-Out Panel Level Package), TSV (Through Silicon Via), and silicon interposers.

In such packaging technology, the wiring and bumps used for electrical connections between semiconductor chips also becomes denser. Therefore, the resist pattern film used for forming wiring and bumps is also required to be fine and dense.

Wiring and bumps are typically plated formed products, and are produced by applying a photosensitive resin composition onto the metal film of a substrate having a metal film such as a copper film to form a resist coating, exposing and developing the resist coating with a mask to form a resist pattern film, and plating the surface of the substrate with the resist pattern film as a mold (refer to Patent Literatures 1 and 2).

CITATION LIST

Patent Literature

Patent Literature 1: JP 2010-008972 A
Patent Literature 2: JP 2006-330368 A

SUMMARY OF INVENTION

Technical Problem

The width of the resist pattern film on the side closer to the substrate (bottom side) may be larger than the width on the side farther from the substrate (top side), and such a shape is called a footing shape. The resist pattern film formed by using the positive photosensitive resin composition tends to have a footing shape.

A plated formed product formed by using a resist pattern film having a footing shape has a small contact area with a substrate (specifically, a metal film), and therefore has a weak adhesive force with the substrate. Particularly, when the pattern on the resist pattern film becomes fine and dense, the plated formed product formed by using the resist pattern film having a footing shape has an extremely small contact area with the substrate, and therefore the adhesive force with the substrate is further weakened, Whereas, during a plating treatment, the plating solution easily penetrates into the contact region between the resist pattern film and the substrate (specifically, the metal film). In this case, the shape of the plated formed product obtained tends to deteriorate. The footing shape of the resist pattern film has an effect of preventing the penetration of the plating solution in the above contact region. Thus, the resist pattern film having a footing shape tends to have excellent resistance to the plating solution.

Therefore, it is considered that suppressing the formation of footing in the resist pattern film and improving the resistance to the plating solution for the resist pattern film are in a trade-off relationship.

The objects of the present invention are to provide a photosensitive resin composition capable of forming a resist pattern film in which the formation of footing is suppressed and the resistance to a plating solution is excellent, and to provide a method for producing a resist pattern film with the above photosensitive resin composition and a method for producing a plated formed product with the above resist pattern film.

Solution to Problem

The present inventors have investigated to solve the above problems. As a result, the present inventors have found that the above problems can be solved by a photosensitive resin composition having the following constitution, and have completed the present invention. That is, the present invention relates to, for example, the following [1] to [7].

[1] A photosensitive resin composition, containing: polymer (A) having an acid dissociative group; photoacid generator (B); and at least one compound (C) selected from compound (C1) represented by formula (C1), compound (C2) represented by formula (C2), and the multimer of the above compound (C2).

[Chemical Formula 1]

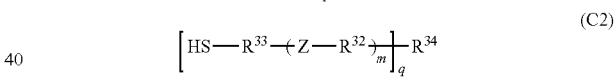

In formulas (C1) and (C2), Z each independently represents an oxygen atom or sulfur atom; in formula (C1), $R^{31}$ each independently represents a monovalent hydrocarbon group or a group obtained by substituting at least one hydrogen atom in the monovalent hydrocarbon group with a mercapto group, and p is an integer of 1 or more; in formula (C1), when p is 1 and when p is an integer of 2 or more and all of Z is an oxygen atom, at least one $R^{31}$ is a group obtained by substituting at least one hydrogen atom in the above monovalent hydrocarbon group with a mercapto group; and in formula (C2), $R^{32}$ and $R^{33}$ each independently represent a divalent hydrocarbon group, $R^{34}$ represents a glycoluril ring structure or an isocyanul ring structure, m is 1 or 0, and q is an integer of 1 to 4.

[2] The photosensitive resin composition according to [1], containing 0.01 to 10 parts by mass of the compound (C) with respect to 100 parts by mass of the polymer (A).

[3] The photosensitive resin composition according to [1] or [2], wherein the compound (C) is the compound (C2).

[4] The photosensitive resin composition according to any one of [1] to [3], wherein the compound (C2) is at least one selected from compound (C2-1) represented by formula (C2-1) and compound (C2-2) represented by formula (C2-2).

[Chemical Formula 2]

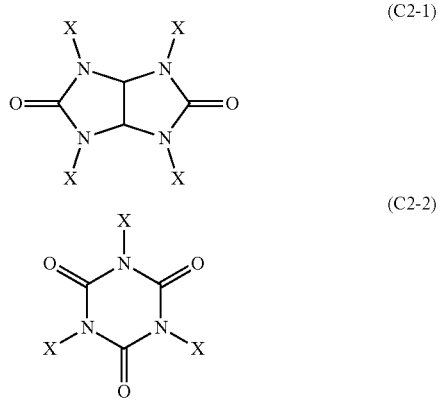

In formulas (C2-1) and (C2-2), X each independently represents a hydrogen atom or a monovalent group represented by formula (g2), and at least one of X in formula (C2-1) is a monovalent group represented by formula (g2) and at least one of X in formula (C2-2) is a monovalent group represented by formula (g2).

[Chemical Formula 3]

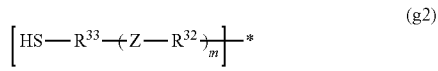

(g2)

In formula (g2), Z, $R^{32}$, $R^{33}$, and m are synonymous with Z, $R^{32}$, $R^{33}$, and m in formula (C2), respectively, and * is a bonding hand with a nitrogen atom in formula (C2-1) or formula (C2-2).

[5] The photosensitive resin composition according to any one of [1] to [4], further containing quencher (D).

[6] A method for producing a resist pattern film, the method including: a step (1) of forming a resin film of the photosensitive resin composition according to any one of [1] to [5] on a metal film of a substrate having the metal film; a step (2) of exposing the resin film; and a step (3) of developing the exposed resin film.

[7] A method for producing a plated formed product, the method including: a step (4) of performing a plasma treatment with an oxygen-containing gas on a plating substrate having on a metal film a resist pattern film produced by the production method according to [6]; and a step (5) of performing, after the plasma treatment, a plating treatment with the resist pattern film as a mold.

Advantageous Effects of Invention

The present invention can provide a photosensitive resin composition capable of forming a resist pattern film in which the formation of footing is suppressed and the resistance to a plating solution is excellent, a method for producing a resist pattern film with the above photosensitive resin composition, and a method for producing a plated formed product with the above resist pattern film.

BRIEF DESCRIPTION OF DRAWING

FIG. 1 is a diagram illustrating a footing shape,

DESCRIPTION OF EMBODIMENTS

Unless otherwise specified, each component exemplified in the present description, for example, each component in the photosensitive resin composition and each structural unit in polymer (A), may be included singly, or two or more thereof may be included.

[Photosensitive Resin Composition]

The photosensitive resin composition of the present invention (hereinafter, also referred to as "the present composition") contains polymer (A) having an acid dissociative group (hereinafter, also referred to as "polymer (A)"), photoacid generator (B), and compound (C) described later.

<Polymer (A)>

Polymer (A) has an acid dissociative group.

The acid dissociative group is a group that can be dissociated by the action of an acid generated from photoacid generator (B). As a result of the dissociation, acidic functional groups such as a carboxy group and a phenolic hydroxyl group are generated in polymer (A). As a result, the solubility of polymer (A) in an alkaline developer changes, and the composition can form a resist pattern film.

Polymer (A) has an acidic functional group protected by an acid dissociative group. Examples of the acidic functional group include a carboxy group and a phenolic hydroxyl group. Examples of polymer (A) include a (meth)acrylic resin in which a carboxy group is protected by an acid dissociative group, and a polyhydroxystyrene resin in which a phenolic hydroxyl group is protected by an acid dissociative group.

The polystyrene-equivalent weight average molecular weight (Mw) of polymer (A) measured by gel permeation chromatography is typically 1000 to 500000, preferably 3000 to 300000, more preferably 10000 to 100000, and still more preferably 20000 to 60000.

The ratio of Mw of polymer (A) to the polystyrene-equivalent number average molecular weight (Mn) measured by gel permeation chromatography, (Mw/Mn), is typically 1 to 5, and preferably 1 to 3.

The present composition can contain one or more polymers (A).

The content ratio of polymer (A) in the present composition is typically 70 to 99.5% by mass, preferably 80 to 99% by mass, and more preferably 90 to 98% by mass in the solid content of 100% by mass of the composition. The above solid content refers to all components other than the organic solvent described later.

<<Structural Unit (a1)>>

Polymer (A) typically has structural unit (a1) having an acid dissociative group, Examples of structural unit (a1) include the structural unit represented by formula (a1-10) and the structural unit represented by formula (a1-20), and the structural unit represented by formula (a1-10) is preferable.

[Chemical Formula 4]

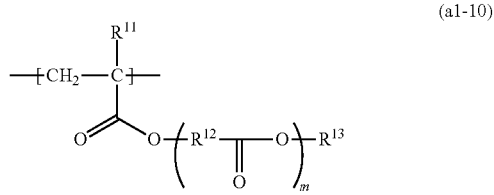

(a1-10)

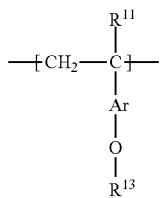

(a1-20)

The meanings of the symbols in formulas (a1-10) and (a1-20) are as follows.

$R^{11}$ is a hydrogen atom, an alkyl group having 1 to 10 carbon atoms, or a group obtained by substituting at least one hydrogen atom in the alkyl group (hereinafter also referred to as "substituted alkyl group") with another group such as a halogen atom including a fluorine atom and a bromine atom, an aryl group including a phenyl group, a hydroxyl group, and an alkoxy group.

$R^{12}$ is a divalent organic group having 1 to 10 carbon atoms.

Ar is an arylene group having 6 to 10 carbon atoms.

$R^{13}$ is an acid dissociative group.

m is an integer of 0 to 10, preferably an integer of 0 to 5, and more preferably an integer of 0 to 3.

Examples of the alkyl group having 1 to 10 carbon atoms include a methyl group, an ethyl group, an n-propyl group, an isopropyl group, an n-butyl group, a pentyl group, and a decyl group.

Examples of the divalent organic group having 1 to 10 carbon atoms include: an alkanediyl group having 1 to 10 carbon atoms such as a methylene group, an ethylene group, a propane-1,3-diyl group, a propane-1,2-diyl group, and a decane-1,10-diyl group; and a group obtained by substituting at least one hydrogen atom in the alkanediyl group with another group such as a halogen atom including a fluorine atom and a bromine atom, an aryl group including a phenyl group, a hydroxyl group, and an alkoxy group.

Examples of the arylene group having 6 to 10 carbon atoms include a phenylene group, a methylphenylene group, and a naphthylene group.

Examples of the acid dissociative group include a group that dissociates due to the action of an acid and thereby generates an acidic functional group such as a carboxy group and a phenolic hydroxyl group in polymer (A), Specific examples thereof include an acid dissociative group represented by formula (g1) and a benzyl group, and the acid dissociative group represented by formula (g1) is preferable.

[Chemical Formula 5]

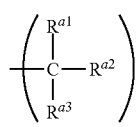

(g1)

In the formula (g1), $R^{a1}$ to $R^{a3}$ each independently represent an alkyl group, an alicyclic hydrocarbon group, or a group obtained by substituting at least one hydrogen atom in the alkyl group or the alicyclic hydrocarbon group with another group such as a halogen atom including a fluorine atom and a bromine atom, an aryl group including a phenyl group, a hydroxyl group, and an alkoxy group. $R^{a1}$ and $R^{a2}$ may be bonded to each other to form an alicyclic structure together with the carbon atom C to which $R^{a1}$ and $R^{a2}$ are bonded.

Examples of the alkyl group of $R^{a1}$ to $R^{a3}$ include an alkyl group having 1 to 10 carbon atoms such as a methyl group, an ethyl group, an n-propyl group, an isopropyl group, an n-butyl group, a pentyl group, and a decyl group.

Examples of the alicyclic hydrocarbon group of $R^{a1}$ to $R^{a3}$ include: a monocyclic saturated cyclic hydrocarbon groups such as a cyclobutyl group, a cyclopentyl group, a cyclohexyl group, a cycloheptyl group, and a cyclooctyl group; a monocyclic unsaturated cyclic hydrocarbon group such as a cyclobutenyl group, a cyclopentenyl group, and a cyclohexenyl group; and a polycyclic saturated cyclic hydrocarbon group such as a norbornyl group, an adamantyl group, a tricyclodecyl group, and a tetracyclododecyl group.

Examples of the alicyclic structure formed by $R^{a1}$, $R^{a2}$, and carbon atom C includes: a monocyclic saturated cyclic hydrocarbon structure such as cyclobutyl, cyclopentyl, cyclohexyl, cycloheptyl, and cyclooctyl; a monocyclic unsaturated cyclic hydrocarbon structure such as cyclobutenyl, cyclopentenyl, and cyclohexenyl; and a polycyclic saturated cyclic hydrocarbon structure such as norbornyl, adamantyl, tricyclodecyl, and tetracyclododecyl.

The groups represented by formulas (g11) to (g15) are preferable as the acid dissociative group represented by formula (g1).

[Chemical Formula 6]

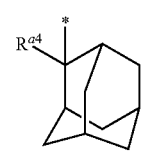

(g11)

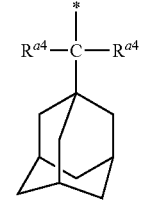

(g12)

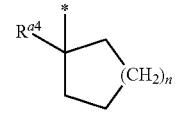

(g13)

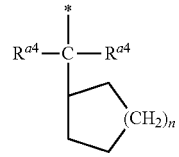

(g14)

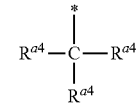

(g15)

In formulas (g11) to (g15), $R^{a4}$ each independently represents an alkyl group having 1 to 10 carbon atoms such as a methyl group, an ethyl group, an isopropyl group, and an n-butyl group, and n is an integer of 1 to 4. Each ring structure in formulas (g11) to (g14) may have one or more substituents such as an alkyl group having 1 to 10 carbon atoms, a halogen atom including a fluorine atom and a bromine atom, a hydroxyl group, and an alkoxy group. * indicates a bonding hand.

In addition to the structural units shown in formulas (a1-10) and (a1-20), examples of structural unit (a1) include: a structural unit having an acetal-based acid dissociative group described in JP 2005-208366 A, JP 2000-194127 A, JP 2000-267283 A, and JP 2004-348106 A; a structural unit having a sultone ring described in JP 2013-101321 A; and a structural unit having a crosslinked acid dissociative group described in JP 2000-214587 A and JP 2000-199960 A.

The structural units described in the above publication shall be described in the present description.

Polymer (A) can have one or more structural units (a1).

The content ratio of structural unit (a1) in polymer (A) is typically 10 to 50 mol %, preferably 15 to 45 mol %, and more preferably 20 to 40 mol %.

In the present description, the content ratio of each structural unit in polymer (A) is a value when the total of all the structural units constituting polymer (A) is 100 mol %. Each of the structural units is typically derived from a monomer in the synthesis of polymer (A). The content ratio of each structural unit can be measured by $^1$H-NMR.

In one embodiment, polymer (A) preferably has the structural unit shown in formula (a1-10) in which $R^{11}$ is a hydrogen atom, and the structural unit represented by formula (a1-10) in which $R^{11}$ is an alkyl group having 1 to 10 carbon atoms or a substituted alkyl group, as structural unit (a1). Such an embodiment tends to allow further improvement of the resolution of the present composition, and to allow further improvement of the swelling resistance and crack resistance to a plating solution for the resist pattern film.

<<Structural Unit (a2)>>

Polymer (A) can further have structural unit (a2) having a group that promotes solubility in an alkaline developer (hereinafter, also referred to as "solubility promoting group"). Polymer (A) having structural unit (a2) can adjust lithographic characteristics such as the resolution, sensitivity, and depth of focus of the resin film formed from the present composition.

Examples of structural unit (a2) includes a structural unit having at least one group or structure selected from a carboxy group, a phenolic hydroxyl group, an alcoholic hydroxyl group, a lactone structure, a cyclic carbonate structure, a sultone structure, and a fluoroalcohol structure (those corresponding to structural unit (a1) are excluded), Of these, a structural unit having a phenolic hydroxyl group is preferable because of being capable of forming a resist pattern film that is resistant to pressing from plating when forming a plated formed product.

Examples of the structural unit having a carboxy group include a structural unit derived from the monomer such as (meth)acrylic acid, crotonic acid, maleic acid, fumaric acid, cinnamic acid, 2-carboxyethyl(meth)acrylate, 2-carboxypropyl (meth)acrylate, and 3-carboxypropyl (meth)acrylate, and a structural unit described in JP 2002-341539 A.

Examples of the structural unit having a phenolic hydroxyl group include a structural unit derived from the monomer having a hydroxyaryl group such as 2-hydroxystyrene, 4-hydroxystyrene, 4-isopropenylphenol, 4-hydroxy-1-vinylnaphthalene, 4-hydroxy-2-vinylnaphthalene, and 4-hydroxyphenyl (meth)acrylate. Examples of the hydroxyaryl group include: a hydroxyphenyl group such as a hydroxyphenyl group, a methylhydroxyphenyl group, a dimethylhydroxyphenyl group, a dichlorohydroxyphenyl group, a trihydroxyphenyl group, and a tetrahydroxyphenyl group; and a hydroxynaphthyl group such as a hydroxynaphthyl group and a dihydroxynaphthyl group.

Examples of the structural unit having an alcoholic hydroxyl group include a structural unit derived from the monomer such as 2-hydroxyethyl(meth)acrylate and 3-(meth)acryloyloxy-4-hydroxytetrahydrofuran, and a structural unit described in JP 2009-276607 A.

Examples of the structural unit having a lactone structure include a structural unit described in JP 2017-058421 A, WO 2009/113228, JP 2010-138330 A, JP 2010-275555 A, JP 2016-098350 A, and JP 2015-214634 A, Examples of the structural unit having a cyclic carbonate structure include a structural unit described in JP 2017-058421 A, JP 2009-223294 A, and JP 2017-044875 A.

Examples of the structural unit having a sultone structure include a structural unit described in JP 2017-058421 A, JP 2014-029518 A, JP 2016-061933 A, and JP 2013-007846 A.

Examples of the structural unit having a fluoroalcohol structure include a structural unit described in JP 2004-083900 A, JP 2003-002925 A, JP 2004-145048 A, and JP 2005-133066 A.

The structural units described in the above publication shall be described in the present description.

Polymer (A) can have one or more structural units (a2).

The content ratio of structural unit (a2) in polymer (A) is typically 10 to 80 mol %, preferably 20 to 65 mol %, and more preferably 25 to 60 mol %. As long as the content ratio of structural unit (a2) is within the above range, the dissolution rate in an alkaline developer can be increased, and as a result, the resolution of the present composition in a thick film can be improved.

Polymer (A) can have structural unit (a2) in the same polymer as or different polymer from the polymer having structural unit (a1); however, polymer (A) preferably has the structural units (a1) to (a2) in the same polymer.

<<Structural Unit (a3)>>

Polymer (A) can further have another structural unit (a3) other than structural units (a1) to (a2).

Examples of structural unit (a3) include:

a structural unit derived from a vinyl compound such as styrene, 2-methylstyrene, 3-methylstyrene, 4-methylstyrene, 2-methoxystyrene, 3-methoxystyrene, 4-methoxystyrene;

a structural unit derived from an aliphatic (meth)acrylic acid ester compound such as methyl(meth)acrylate, ethyl(meth)acrylate, n-butyl(meth)acrylate, n-pentyl (meth)acrylate, n-hexyl(meth)acrylate, 2-ethylhexyl (meth)acrylate, 2-methoxyethyl(meth)acrylate, 2-methoxybutyl(meth)acrylate, lauroyloxytetraethyleneglycol(meth)acrylate, lauroyloxydipropyleneglycol (meth)acrylate, and lauroyloxytripropyleneglycol (meth)acrylate;

a structural unit derived from an alicyclic (meth)acrylic acid ester compound such as cyclopentyl(meth)acrylate, norbornyl(meth)acrylate, isobornyl(meth)acrylate, tricyclodecanyl(meth)acrylate, dicyclopentenyl(meth) acrylate, tetrahydrofuranyl(meth)acrylate, and tetrahydropyranyl(meth)acrylate;

a structural unit derived from an aromatic ring-containing (meth)acrylic acid ester compound such as phenyl (meth)acrylate and phenethyl(meth)acrylate;

a structural unit derived from an unsaturated nitrile compound such as (meth)acrylonitrile, croton nitrile, maleine nitrile, and fumaronitrile;

a structural unit derived from an unsaturated amide compound such as (meth)acrylamide and N, N-dimethyl (meth)acrylamide; and a structural unit derived from an unsaturated imide compound such as maleimide, N-phenylmaleimide, and N-cyclohexylmaleimide.

Polymer (A) can have one or more structural units (a3).

The content ratio of structural unit (a3) in polymer (A) is typically 40 mol % or less.

Polymer (A) can have structural unit (a3) in the same polymer as or different polymer from the polymer having structural unit (a1) and/or structural unit (a2); however, polymer (A) preferably has the structural units (a1) to (a3) in the same polymer.

<<Method for Producing Polymer (A)>>

Polymer (A) can be produced by polymerizing the monomer corresponding to each structural unit in a suitable polymerization solvent by a known polymerization method such as an ionic polymerization method or a radical polymerization method. Of these, the radical polymerization method is preferable.

Examples of the radical polymerization initiator used in the radical polymerization method include: the azo compound such as 2,2'-azobisisobutyronitrile, 2,2'-azobis(methylisobutyrate), and 2,2'-azobis-(2,4-dimethylvaleronitrile); and an organic peroxide such as benzoylperoxide, laurylperoxide, and t-butylperoxide.

In addition, in the polymerization, a molecular weight modifier such as a mercaptan compound or a halogen hydrocarbon can be used, as necessary.

<Photoacid Generator (B)>

Photoacid generator (B) is a compound that generates an acid by exposure. The action of this acid makes dissociated the acid dissociative group in polymer (A) to generate an acidic functional group such as a carboxy group and a phenolic hydroxyl group. As a result, the exposed portion of the resin film formed from the present composition becomes easily soluble in an alkaline developer, and a positive resist pattern film can be formed. As described above, the present composition functions as a chemically amplified positive photosensitive resin composition.

Examples of photoacid generator (B) include compounds described in JP 2004-317907 A, JP 2014-157252 A, JP 2002-268223 A, JP 2017-102260 A, JP 2016-018075 A, and JP 2016-210761 A. These shall be described herein.

Specific examples of photoacid generator (B) include: an onium salt compound such as diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium hexafluoroantimonate, triphenylsulfonium hexafluorophosphate, 4-t-butylphenyl diphenylsulfonium trifluoromethanesulfonate, 4-t-butylphenyl diphenylsulfonium benzenesulfonate, 4,7-di-n-butoxynaphthyltetrahydrothiophenium trifluoromethanesulfonate, 4,7-di-n-butoxynaphthyltetrahydrothiophenium bis(trifluoromethanesulfonyl)imide anion, 4,7-di-n-butoxynaphthyltetrahydrothiophenium bis(nonafluorobutylsulfonyl)imide anion, and 4,7-di-n-butoxynaphthyltetrahydrothiophenium tris(nonafluorobutylsulfonyl)methide; a halogen-containing compound such as 1,10-dibromo-n-decane, 1,1-bis(4-chlorophenyl)-2,2,2-trichloroethane, phenyl-bis(trichloromethyl)-s-triazine, 4-methoxyphenyl-bis(trichloromethyl)-s-triazine, styryl-bis(trichloromethyl)-s-triazine, and naphthyl-bis(trichloromethyl)-s-triazine; a sulfone compound such as 4-trisphenacyl sulfone, mesitylphenacyl sulfone, and bis(phenylsulfonyl) methane; a sulfonic acid compound such as benzointosilate, pyrogalloltristrifluoromethanesulfonate, o-nitrobenzyltrifluoromethanesulfonate, and o-nitrobenzyl-p-toluenesulfonate; a sulfone imide compound such as N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)-4-butyl-naphthylimide, N-(trifluoromethylsulfonyloxy)-4-propylthio-naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboxyimide, N-(4-fluorophenylsulfonyloxy)bicyclo[2.1.1]heptane-5,6-oxy-2,3-dicarboxyimide, and N-(4-fluorophenylsulfonyloxy)naphthylimide, N-(10-campasulfonyloxy)naphthylimide; and a diazomethane compound such as bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl-p-toluenesulfonyldiazomethane, cyclohexylsulfonyl-1,1-dimethylethylsulfonyldiazomethane, and bis(1,1-dimethylethylsulfonyl)diazomethane.

Of these, the onium salt compound and/or sulfonimide compound are preferable because of being capable of forming the resist pattern film that is excellent in resolution and resistance to a plating solution.

The present composition can contain one or more photoacid generators (B).

The content of photoacid generator (B) in the present composition is typically 0.1 to 20 parts by mass, preferably 0.3 to 15 parts by mass, and more preferably 0.5 to 10 parts by mass with respect to 100 parts by mass of polymer (A), When the content of photoacid generator (B) is within the above range, the resist pattern film having better resolution tends to be obtained.

<Compound (C)>

Compound (C) is at least one selected from compound (C1) represented by formula (C1), compound (C2) represented by formula (C2), and the multimer of compound (C2) described below. The compound (C2) is preferable because the formation of footing is more suppressed.

It is presumed that using the present composition containing compound (C) suppresses the formation of footing, which is a problem in the positive photosensitive resin composition, and can also form a resist pattern film having excellent resistance to a plating solution.

The reason why the present invention exhibits the above effects is presumed as follows.

The acid generated by exposure from photoacid generator (B) included in the photosensitive resin composition is considered to act as an oxidizing agent for a metal film such as a copper film. Therefore, in the resin film formed from the above composition, the amount of the acid generated by exposure is reduced near the metal film, and as a result, the resist pattern film formed by development has a footing shape. Therefore, it is considered that the cause of the footing is the contact between the metal film such as the copper film and the acid generated by photoacid generator (B), that is, the quenching of the acid by the above metal film. With forming on the metal film the resin film including compound (C) having a mercapto group (and a sulfide bond that generates a mercapto group) having a high affinity for metals and metal oxides, compound (C) and the metal film form a thin composite film, and this thin film can avoid the above contact. It is presumed that such a composite film is successfully formed by using compound (C) having the structure described below.

In addition, when the bottom portion of the resist pattern film is highly hydrophilic, the plating solution containing a hydrophilic solvent such as water and alcohol may penetrate between the bottom portion and the metal film. Increasing the hydrophobicity of the bottom portion can prevent the above penetration of the plating solution. Compound (C) is highly hydrophobic, and therefore such a bottom portion can be formed by using the present composition.

The above description is speculative and does not limit the present invention.

The partition coefficient is an index for the hydrophobicity of compound (C). The partition coefficient of compound (C) is preferably 2 to 10, and more preferably 3 to 7. The partition coefficient is the value of the octanol/water partition coefficient (logP) calculated by the ClogP method, and the value is larger, meaning that the hydrophobicity (fat solubility) is higher.

The present composition can contain one or more compounds (C).

The content of compound (C) in the present composition is typically 0.01 to 10 parts by mass, preferably 0.02 to 1 parts by mass, and more preferably 0.05 to 0.5 parts by mass with respect to 100 parts by mass of polymer (A). In such an aspect, the present composition can more exhibit the above effect.

<<Compound (C1)>>

Compound (C1) is a compound represented by formula (C1).

[Chemical Formula 7]

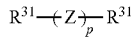

(C1)

In formula (C1), Z each independently represents an oxygen atom or a sulfur atom. $R^{31}$ each independently represents a monovalent hydrocarbon group or a group obtained by substituting at least one hydrogen atom in the monovalent hydrocarbon group with a mercapto group (hereinafter, also referred to as "mercapto substituent"). p is an integer of 1 or more, and preferably an integer of 1 to 4. For example, when Z is a sulfur atom and p is 3, compound (C1) has a trisulfide bond. When p is 1 and when p is an integer of 2 or more and all of Z is an oxygen atom, at least one $R^{31}$ is a group obtained by substituting at least one hydrogen atom in the above monovalent hydrocarbon group with a mercapto group (mercapto substituent).

When Z is a sulfur atom, p is preferably an integer of 1 to 4, more preferably an integer of 2 to 3. When Z is an oxygen atom, p is preferably 1.

The monovalent hydrocarbon group of $R^{32}$ is typically a monovalent hydrocarbon group having 1 to 12 carbon atoms. Examples of the monovalent hydrocarbon group include an alkyl group, an aryl group, and an arylalkyl group, Examples of the alkyl group of $R^{31}$ include an alkyl group having 1 to 10 carbon atoms such as a methyl group, an ethyl group, an n-propyl group, an isopropyl group, a pentyl group, and a decyl group.

Examples of the aryl group of $R^{31}$ include an aryl group having 6 to 10 carbon atoms such as a phenyl group, a methylphenyl group, and a naphthyl group.

Examples of the arylalkyl group of $R^{31}$ include an arylalkyl group having 7 to 12 carbon atoms such as a benzyl group and a phenethyl group.

Examples of the mercapto substituent include a 4-mercaptophenyl group.

In compound (C1), for example, a sulfide bond, an ether bond (when p=1), a polysulfide bond (when p=2 or more and all of Z is a sulfur atom), or a mercapto group (when $R^{31}$ is a mercapto substituent) is bound to the hydrocarbon structure. Therefore, it is presumed that compound (C1) has high hydrophobicity.

Examples of compound (C1) include compounds represented by the following formulas (C1-1) to (C1-3).

[Chemical Formula 8]

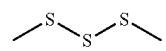

(C1-1)

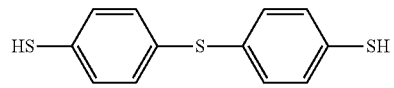

(C1-2)

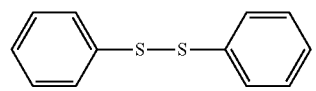

(C1-3)

<<Compound (C2) and its Multimer>>

Compound (C2) is a compound represented by formula (C2).

[Chemical Formula 9]

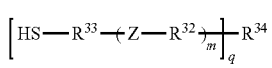

(C2)

The meaning of each symbol in formula (C2) is as follows.

Z each independently represents an oxygen atom or a sulfur atom.

$R^{32}$ and $R^{33}$ each independently represent a divalent hydrocarbon group, preferably an alkanediyl group, an arylene group, or an arylene alkanediyl group, and of these, an alkanediyl group is more preferable because the formation of footings is suppressed and a resist pattern film having excellent resistance to a plating solution can be formed, The alkanediyl group typically has 1 to 12 carbon atoms, and preferably 2 to 12 carbon atoms. Examples of the alkanediyl group include: a linear alkanediyl group such as a methylene group, an ethylene group, a propane-1,3-diyl group, a butane-1,4-diyl group, a pentane-1,5-diyl group, a hexane-1,6-diyl group, an octane-1,8-diyl group, a decane-1,10-diyl group, and a dodecane-1,12-diyl group; and a branched alkanediyl group such as 1-methylpropane-1,3-diyl group, 2-methylpropane-1,3-diyl group, 1-methylbutane-1,4-diyl group, and 2-methylbutane-1,4-diyl group. Of these, a linear alkanediyl group is preferable.

Examples of the arylene group include an arylene group having 6 to 10 carbon atoms such as a phenylene group, a methylphenylene group, and a naphthylene group.

The arylene alkanediyl group is a divalent group obtained by bonding one or more arylene groups with one or more alkanediyl groups in an arbitrary order. Examples of each of arylene group and alkanediyl group include the above specific examples.

$R^{34}$ represents a glycoluril ring structure or an isocyanul ring structure. Although the glycoluril ring structure and the isocyanul ring structure have a bond that can reduce the hydrophobicity, it is presumed that the hydrophobicity of compound (C2) is not deteriorated because of the high structural symmetry thereof.

m is 1 or 0.

q is an integer of 1 to 4. When $R^{34}$ is a glycoluril ring structure, q is an integer of 1 to 4. When $R^{34}$ is an isocyanul ring structure, q is an integer of 1 to 3. When q is an integer of 2 or more, the group represented by $—(R^{32}—Z)_m—R^{33}—$SH in formula (C2) may be the same or different, In compound (C2), the mercapto group, sulfide bond, or ether bond (when m is 1) is bonded to the hydrocarbon structure. Therefore, it is presumed that compound (C2) has high hydrophobicity.

Compound (C2-1) represented by formula (C2-1) and compound (C2-2) represented by formula (C2-2) are preferable, and compound (C2-1) is more preferable, as compound (C2),

[Chemical Formula 10]

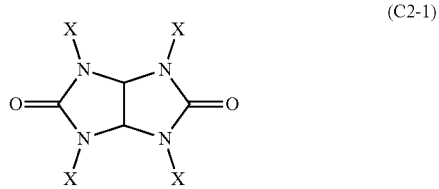

(C2-1)

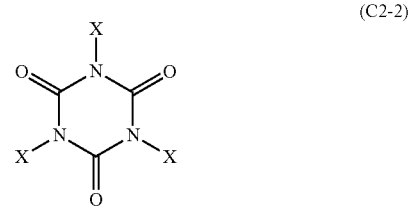

(C2-2)

In formulas (C2-1) and (C2-2), X each independently represents a hydrogen atom or a monovalent group represented by formula (g2). However, in formula (C2-1), at least one X is a monovalent group represented by formula (g2), and preferably all of X are monovalent groups represented by formula (g2). In addition, in formula (C2-2), at least one X is a monovalent group represented by formula (g2), and preferably all of X are monovalent groups represented by formula (g2).

[Chemical Formula 11]

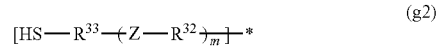

(g2)

In formula (g2), Z, $R^{32}$, $R^{33}$, and m are synonymous with Z, $R^{32}$, $R^{33}$, and m in formula (C2), respectively, and * is a bonding hand with a nitrogen atom in formula (C2-1) or formula (C2-2).

Examples of compound (C2-1) include 1,3,4,6-tetrakis[2-mercaptoethyl]glycoluril, 1,3,4,6-tetrakis[3-(2-mercaptoethylsulfanyl)propyl]glycoluril, 1,3,4,6-tetrakis[3-(3-mercaptopropylsulfanyl)propyl]glycoluril, 1,3,4,6-tetrakis[3-(4-mercaptobutylsulfanyl)propyl]glycoluril, 1,3,4,6-tetrakis[3-(5-mercaptopentylsulfanyl)propyl]glycoluril, 1,3,4,6-tetrakis[3-(6-mercaptohexylsulfanyl)propyl]glycoluril, 1,3,4,6-tetrakis[3-(8-mercaptooctylsulfanyl)propyl]glycoluril, 1,3,4,6-tetrakis[3-(10-mercaptodecylsulfanyl)propyl]glycoluril, and 1,3,4,6-tetrakis[3-(12-mercaptododecylsulfanyl)propyl]glycoluril.

Examples of the compound (C2-2) include 1,3,5-tris[2-mercaptoethyl]isocyanurate, 1,3,5-tris[3-mercaptopropyl]isocyanurate, 1,3,5-tris[2-(3-mercaptopropoxy)ethyl]isocyanurate, 1,3,5-tris[3-(2-mercaptoethylsulfanyl)propyl]isocyanurate, 1,3,5-tris[3-(3-mercaptopropylsulfanyl)propyl]isocyanurate, 1,3,5-tris[3-(4-mercaptobutylsulfanyl)propyl]isocyanurate, 1,3,5-tris[3-(5-mercaptopentylsulfanyl)propyl]isocyanurate, 1,3,5-tris[3-(6-mercaptohexylsulfanyl)propyl]isocyanurate, 1,3,5-tris[3-(8-mercaptooctylsulfanyl)propyl]isocyanurate, 1,3,5-tris[3-(10-mercaptodecylsulfanyl)propyl]isocyanurate, and 1,3,5-tris[3-(12-mercaptododecylsulfanyl)propyl]isocyanurate.

Compound (C2) can be synthesized, for example, by the methods described in JP 2016-169174 A, JP 2016-164135 A, and JP 2016-164134 A.

Compound (C2) may form a multimer. The above multimer is a multimer obtained by forming a disulfide bond by coupling a plurality of compounds (C2) with a mercapto group, The multimer is, for example, a dimer to a pentamer of compound (C2).

<Quencher (D)>

The present composition can further contain quencher (D).

Quencher (D) is, for example, a component used to control the diffusion of the acid generated by exposure from photoacid generator (B) in the resin film, and can thus improve the resolution of the present composition.

Examples of quencher (D) include a basic compound and the compound that generates a base, and examples thereof include compounds described in JP 2011-029636 A, JP 2014-013381 A, JP 2015-526752 A, JP 2016-099483, and JP 2017-037320. These shall be described herein.

Examples of quencher (D) include: an alkylamine such as n-hexylamine, n-heptylamine, di-n-butylamine, and triethylamine; an aromatic amine such as aniline and 1-naphthylamine; an alkanolamine such as triethanolamine; a polyamino compound such as ethylenediamine, 1,3-bis[1-(4-aminophenyl)-1-methylethyl]benzene, and polyethyleneimine; an amide compound such as formamide; an urea compound such as urea and methylurea; a nitrogen-containing heterocyclic compound such as imidazole and benzimidazole; and a nitrogen-containing compound with an acid dissociative group such as N-(t-butoxycarbonyl)piperidine, N-(t-butoxycarbonyl)-4-hydroxypiperidine, N-(t-butoxycarbonyl)imidazole, N-(t-butoxycarbonyl)benzimidazole, and N-(t-)butoxycarbonyl)-2-phenylbenzimidazole.

The present composition can contain one or more quenchers (D).

The content of quencher (D) in the present composition is typically 0.001 to 10 parts by mass, and preferably 0.01 to 5 parts by mass, with respect to 100 parts by mass of polymer (A).

<Other Components>

The present composition can further contain other components.

Examples of the other components include: a surfactant that has the effect of improving antifoaming properties and the coatability of the photosensitive resin composition; a sensitizer that absorbs exposure light and improves the acid generation efficiency of the photoacid generator; an alkali-soluble resin or low-molecular-weight phenol compound that controls the dissolution rate of the resin film formed from the photosensitive resin composition in an alkaline developer; an ultraviolet absorber that blocks the light reaction caused by the scattered light wrapping around the unexposed area during exposure; a thermal polymerization inhibitor that enhances the storage stability of the photosensitive resin composition; and others such as an antioxidant, an adhesive aid, and an inorganic filler.

<Organic Solvent>

The present composition can further contain an organic solvent. The organic solvent is, for example, a component used for uniformly mixing each component included in the present composition.

Examples of the organic solvent include: an alcoholic solvent such as ethylene glycol monomethyl ether, ethylene glycol monoethyl ether, diethylene glycol, diethylene glycol monoethyl ether, and ethyl lactate, propylene glycol monomethyl ether; an ester solvent such as ethyl acetate, ethyl 2-hydroxypropionate, ethyl 2-hydroxy-2-methylpropionate, methyl acetoacetate, ethyl ethoxyacetate, and γ-butyrolactone; a ketone solvent such as methylamylketone and cyclohexanone; an alkylene glycol dialkyl ether such as diethylene glycol dimethyl ether, diethylene glycol diethyl ether, diethylene glycol di-n-propyl ether, and dipropylene glycol dimethyl ether; and an alkylene glycol monoalkyl ether acetate such as ethylene glycol monomethyl ether acetate, ethylene glycol monoethyl ether acetate, propylene glycol monomethyl ether acetate, propylene glycol monoethyl ether acetate, and propylene glycol mono-n-propyl ether acetate.

The present composition can contain one or more organic solvents.

The content ratio of the organic solvent in the present composition is typically 40 to 90% by mass.

<Production of Photosensitive Resin Composition>

The present composition can be produced by uniformly mixing each of the above components. In addition, in order to remove impurities, each of the above components are uniformly mixed, and then the obtained mixture can be filtered with a filter.

[Photosensitive Resin Composition Kit]

One embodiment of the present invention includes a photosensitive resin composition kit having: a first agent containing compound (C) and an organic solvent; and a second agent containing polymer (A) having an acid dissociative group, and photoacid generator (B). Details of each component are as described above.

The content ratio of compound (C) in the first agent is typically 0.0001 to 10% by mass, and preferably 0.001 to 1% by mass. The second agent can also contain the above quencher (D), other components, and an organic solvent, for example. The content (content ratio) of each component in the second agent is the same as the content (content ratio) of each component in the above photosensitive resin composition or the solid content thereof.

For example, the photosensitive resin composition kit can be used by the method of applying the first agent onto the metal film of the substrate having a metal film, and then forming the resin film of the second agent onto the metal film that has been surface-treated by the first agent. Subsequent steps are the same as steps (2) and (3) described below. It is considered that the effect of the present invention is also exhibited by this method for the above presumed reason that the film containing compound (C) is formed on the metal film.

[Method for Producing Resist Pattern Film]

The method for producing a resist pattern film includes: a step (1) of forming a resin film of the photosensitive resin composition on the metal film of a substrate having metal film; a step (2) of exposing the resin film; and a step (3) of developing the exposed resin film.

<Step (1)>

Examples of the substrate include a semiconductor substrate and a glass substrate. The shape of the substrate is not particularly limited, and the surface shape includes a flat plate shape and an uneven shape, and the shape of the substrate includes a circular shape and a square shape. In addition, there is no limit to the size of the substrate.

Examples of the metal film include a film containing a metal such as aluminum, copper, silver, gold and palladium, and a film containing an alloy containing two or more the metals, and a copper film, that is, the film including copper and/or copper alloy is preferable. The thickness of the metal film is typically 100 to 10000 Å, and preferably 500 to 2000 Å. The metal film is typically provided on the surface of the substrate. The metal film can be formed by a method such as a sputtering method.

The resin film is typically formed by applying the present composition onto the metal film of a substrate having a metal film. Examples of the coating method of the present composition include a spin coating method, a roll coating method, a screen printing method, and an applicator method, and of these, the spin coating method and the screen printing method are preferable.

The present composition is applied, and then the present composition applied can be heat-treated for the purpose of, for example, volatilizing the organic solvent. The conditions for the heat treatment are typically 0.5 to 20 minutes at 50 to 200° C.

The thickness of the resin film is typically 1 to 100 μm, and preferably 5 to 80 μm.

<Step (2)>

In the step (2), the resin film formed in the step (1) is exposed.

The exposure is typically performed on the resin film selectively by a unit magnification projection exposure or reduced projection exposure via a photomask having a predetermined mask pattern. Examples of the exposure light include ultraviolet rays or visible light having a wavelength of 150 to 600 nm, and preferably 200 to 500 nm. Examples of the light source of the exposure light include a low-pressure mercury lamp, a high-pressure mercury lamp, an ultra-high-pressure mercury lamp, a metal halide lamp, and a laser. The exposure amount can be appropriately selected depending on the type of exposure light, the type of the photosensitive resin composition, and the thickness of the resin film, and is typically 100 to 20,000 mJ/cm$^2$.

After the exposure to the resin film, the resin film can be heat-treated before development. The conditions for the heat treatment are typically 0.5 to 10 minutes at 70 to 180° C. The above heat treatment can promote the dissociation reaction of the acid dissociative group by the acid in polymer (A).

<Step (3)>

In the step (3), the resin film exposed in the step (2) is developed to form a resist pattern film. Development is typically performed by using an alkaline developer. Examples of the developing method include a shower method, a spray method, a dipping method, a liquid filling method, and a paddle method. The developing conditions are typically 1 to 30 minutes at 10 to 30° C.

Examples of the alkaline developer include an aqueous solution containing one or more alkaline substances. Examples of the alkaline substance include sodium hydroxide, potassium hydroxide, sodium carbonate, sodium silicate, aqueous ammonia, ethylamine, n-propylamine, diethylamine, triethylamine, monoethanolamine, diethanolamine, triethanolamine, tetramethylammonium hydroxide, tetraethylammonium hydroxide, choline, pyrrole, and piperidine. The concentration of the alkaline substance in the alkaline developer is typically 0.1 to 10% by mass. The alkaline developer can further contain, for example, an organic solvent such as methanol, or ethanol and/or a surfactant.

The resist pattern film formed by development can be washed with water for example. Then, the above resist pattern film can be dried by using an air gun or a hot plate.

As described above, the resist pattern film that serves as a mold for forming a plated formed product can be formed on the metal film of the substrate while suppressing the formation of footing. Thus, a plating substrate having the resist pattern film (mold) on the metal film can be obtained. The thickness of the resist pattern film is typically 1 to 100 μm, and preferably 5 to 80 μm. A shape suitable for the type of the plated formed product can be selected as the shape of the opening of the resist pattern film. When the plated formed product is a wiring, the shape of the pattern is, for example, a line-and-space pattern, and when the plated formed product is a bump, the shape of the opening is, for example, a cubic hole pattern.

Using the plating substrate having a mold with the formation of footing suppressed increases the contact area between the substrate (specifically, the metal film) and the plated formed product, and therefore can produce the plated formed product that is excellent in adhesion to the substrate.

[Method for Producing Plated Formed Product]

A method for producing a plated formed product includes: a step (4) of performing a plasma treatment with an oxygen-containing gas on a plating substrate having on a metal film a resist pattern film produced by the method for producing a resist pattern film according to the present invention; and a step (5) of performing, after the plasma treatment, a plating treatment with the resist pattern film as a mold.

<Step (4)>

In the step (4), performing the plasma treatment with the oxygen-containing gas (surface treatment of the plating substrate) can enhance the affinity between the metal film surface and the plating solution, This is presumed to be due to the following reasons. It is considered that compound (C)-containing film that has not been removed by development is formed on the surface of the metal film at the opening of the resist pattern film. Sulfur atoms included in compound (C) can cause uneven plating and corrosion. Therefore, the plating treatment can be satisfactorily performed by removing compound (C)-containing film on the surface of the metal film at the opening of the resist pattern film by plasma treatment after the formation of the resist pattern film and before the plating treatment. The above description is speculative and does not limit the present invention.

In the step (4), for example, the plating substrate having the resist pattern film on the metal film is placed in a vacuumed apparatus, oxygen plasma is emitted, and the surface treatment of the plating substrate is performed. The plasma treatment conditions are that the power supply output is typically 50 to 300W, the flow rate of oxygen-containing gas is typically 20 to 150 mL, the pressure inside the apparatus is typically 10 to 30 Pa, and the treatment time is typically 0.5 to 30 minutes. The oxygen-containing gas can contain one or more gases selected from, for example, hydrogen, argon, and methane tetrafluoride, in addition to oxygen. The plating substrate surface-treated by the plasma treatment can be washed with water for example.

<Step (5)>

In the step (5), after the plasma treatment, the resist pattern film is used as a mold to form a plated formed product by the plating treatment in the opening (the portion removed by development) defined by the resist pattern film.

Examples of the plated formed product include a bump and wiring. The plated formed product consists of, for example, a conductor such as copper, gold, and nickel. The thickness of the plated formed product varies depending on the application thereof. For example, in the case of a bump, the thickness is typically 5 to 100 μm, preferably 10 to 80 μm, and more preferably 20 to 60 μm. In the case of a wiring, the thickness is typically 1 to 30 μm, preferably 3 to 20 μm, and more preferably 5 to 15 μm.

Examples of the plating treatment include a plating solution treatment using a plating solution. Examples of the plating solution include copper plating solution, gold plating solution, nickel plating solution, and solder plating solution. Specific examples thereof include a copper plating solution including copper sulfate or copper pyrophosphate, a gold plating solution including gold potassium cyanide, and a nickel plating solution including nickel sulfate or nickel carbonate. Of these, a copper plating solution is preferable. The plating solution typically contains a hydrophilic solvent such as water and alcohol.

Specific examples of the plating treatment include the wet plating treatment such as electrolytic plating treatment, electroless plating treatment, and melting plating treatment. When forming a bump and wiring in processing at the wafer level, the electrolytic plating treatment is typically performed.

In the case of the electrolytic plating treatment, the plating film formed on the inner wall of the resist pattern film by the sputtering method or the electroless plating treatment can be used as the seed layer, and the above metal film on the substrate can also be used as the seed layer. Furthermore, a barrier layer may be formed before the seed layer is formed, and the seed layer can be used as the barrier layer.

The conditions of the electrolytic plating treatment can be appropriately selected depending on, for example, the type of plating solution. In the case of a copper plating solution, the temperature is typically 10 to 90° C., preferably 20 to 70° C., and the current density is typically 0.3 to 30 $A/dm^2$, preferably 0.5 to 20 $A/dm^2$. In the case of a nickel plating solution, the temperature is typically 20 to 90° C., preferably 40 to 70° C., and the current density is typically 0.3 to 30 $A/dm^2$, preferably 0.5 to 20 $A/dm^2$.

Different plating treatments can be sequentially performed as the plating treatment. For example, a copper-pillar bump can be formed by first performing a copper plating treatment, then performing a nickel plating treatment, and then performing a melting solder plating treatment.

<Other Steps>

The method for producing a plated formed product of the present invention can further include a step of removing the above resist pattern film after the step (5). Specifically, this step is a step of peeling and removing the remaining resist pattern film, and examples thereof include a method of immersing a substrate having a resist pattern film and a plated formed product in a peeling solution. The temperature and immersion time of the peeling solution is typically 1 to 10 minutes at 20 to 80° C.

Examples of the peeling solution include a peeling solution containing at least one selected from tetramethylammonium hydroxide, dimethyl sulfoxide, and N, N-dimethylformamide.

The method for producing a plated formed product of the present invention can further include a step of removing, for example, by a wet etching method the metal film in the region other than the region with the plated formed product formed.

EXAMPLES

Hereinafter, the present invention will be described in more detail based on examples, but the present invention is not limited to these examples.

<Weight Average Molecular Weight of Polymer (Mw)>

The weight average molecular weight (Mw) of the polymer was measured by the gel permeation chromatography method under the following conditions.

GPC apparatus: product name "HLC-8220-GPC" manufactured by Tosoh Corporation

Column: TSK-M and TSK2500 columns manufactured by Tosoh Corporation were connected in series Solvent: tetrahydrofuran Temperature: 40° C.

Detection method: refractive index method

Standard substance: polystyrene

Synthesis Examples 1 and 2

Polymers (A-1) and (A-2) having the structural units and the content ratios thereof shown in Table 1 were produced by radical polymerization using 2,2'-azobis(methylisobutyrate) as a radical polymerization initiator. Details of the structural units shown in Table 1 are described in the following formulas (a1-1) to (a1-4), (a2-1) to (a2-2), and (a3-1) to (a3-2). The unit of the numerical values in columns a1-1 to a3-2 in Table 1 is mol %. The content ratio of each structural unit was measured by 1H-NMR.

[Chemical Formlua 12]

(a1-1)
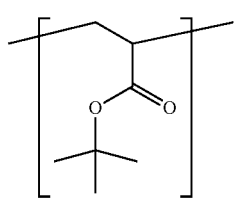

(a1-2)
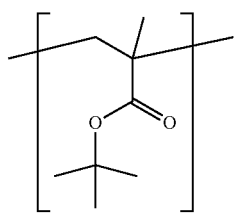

(a1-3)
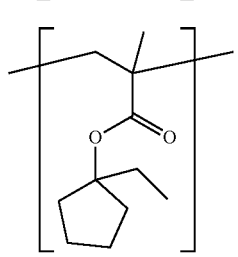

(a1-4)
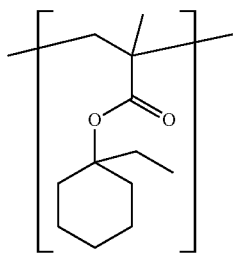

(a2-1)
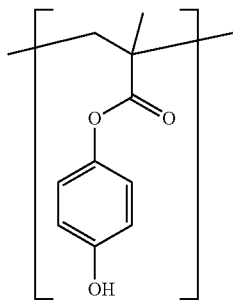

(a2-2)

(a3-1)
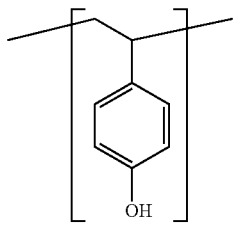

(a3-2)
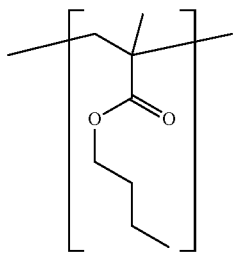

[Table 1]

TABLE 1

| Polymer | a1-1 | a1-2 | a1-3 | a1-4 | a2-1 | a2-2 | a3-1 | a3-2 | Mw |
|---|---|---|---|---|---|---|---|---|---|
| A-1 | 10 | 10 |  | 20 | 45 |  |  | 15 | 40120 |
| A-2 | 25 |  | 10 |  | 25 | 20 | 20 |  | 21500 |

<Production of Photosensitive Resin Composition>

[Examples 1A to 9A, Comparative Examples 1A to 3A] Production Of Photosensitive Resin Composition The photosensitive resin compositions of Examples 1A to 9A and Comparative Examples 1A to 3A were produced by uniformly mixing each component of the type and amount shown in Table 2 below. Details of each component other than the polymer component are as follows. The unit of the numerical value in Table 2 is part by mass.

B-1: compound represented by the following formula (B-1)

B-2: compound represented by the following formula (B-2)

[Chemical Formula 13]

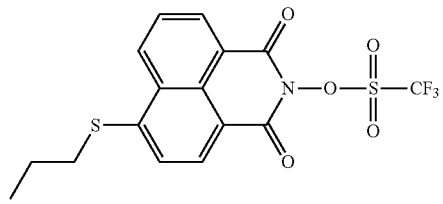

(B-1)

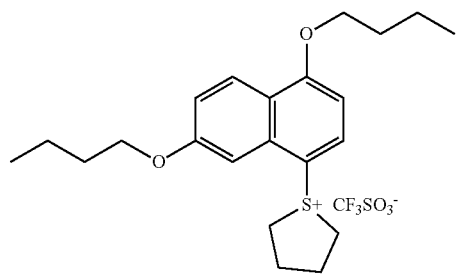

(B-2)

C-1: dimethyl trisulfide

C-2: 4,4'-thiobisbenzenethiol

C-3: compound represented by the following formula (C-3)

[Chemical Formula 14]

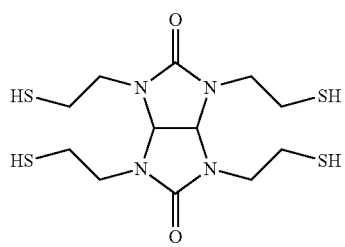

(C-3)

C-4: compound represented by the following formula (C-4) was synthesized by the following production method.

With reference to paragraphs to of Examples of JP 2015-059099 A, the starting material glycoluril was changed to isocyanuric acid to synthesize 1,3,5-trisallylisocyanuric acid, and then the reaction with thioacetic acid synthesized 1,3,5-tris[3-mercaptopropyl]isocyanurate (C-4).

[Chemical Formula 15]

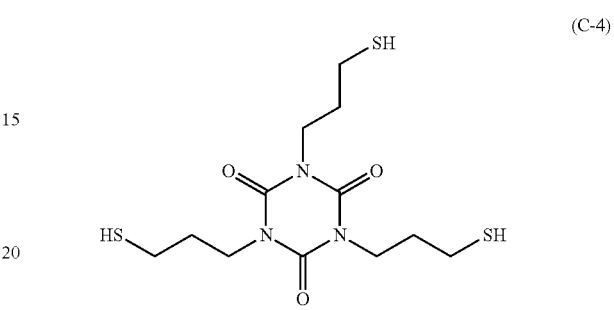

(C-4)

C-5: compound represented by the following formula (C-5) (manufactured by Kawaguchi Chemical Industry Co., Ltd.).

[Chemical Formula 16]

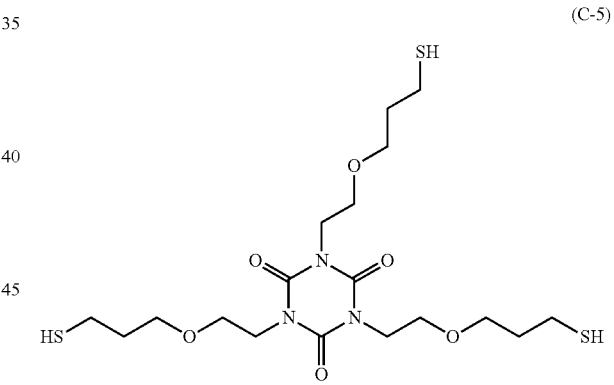

(C-5)

RC-1: compound represented by the following formula (RC-1)

[Chemical Formula 17]

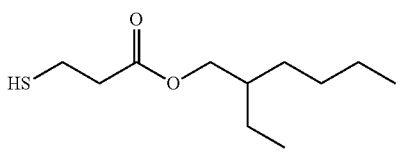

(RC-1)

RC-2: 2-mercaptoethanol

RC-3: compound represented by the following formula (RC-3)

[Chemical Formula 18]

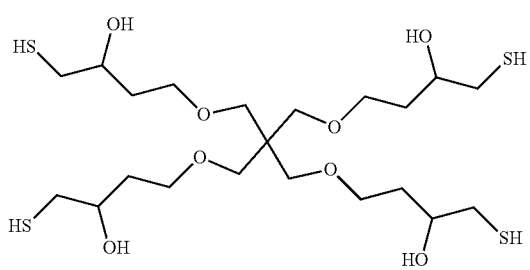

(RC-3)

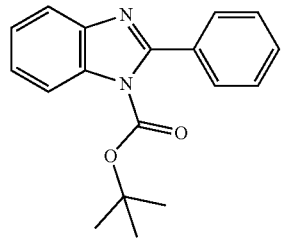

(D-2)

E-1: fluorine-based surfactant (product name "NBX-15", manufactured by Neos Corporation)

F-1: γ-butyrolactone

F-2: cyclohexanone

F-3: propylene glycol monomethyl ether acetate

[Table 2]

|  | Example 1A | Example 2A | Example 3A | Example 4A | Example 5A | Example 6A | Example 7A | Example 8A | Example 9A | Comparative Example 1A | Comparative Example 2A | Comparative Example 3A |
|---|---|---|---|---|---|---|---|---|---|---|---|---|
| A-1 | 100 | 100 | 100 | 100 | 100 |  |  | 100 |  | 100 | 100 | 100 |
| A-2 |  |  |  |  |  | 100 | 100 |  | 100 |  |  |  |
| B-1 | 1 | 1 | 1 |  | 1 | 1 |  |  |  | 1 | 1 | 1 |
| B-2 |  |  |  | 3 |  |  | 3 | 3 | 3 |  |  |  |
| C-1 | 1 |  |  | 0.5 |  |  |  |  |  |  |  |  |
| C-2 |  | 0.2 |  |  | 0.1 |  |  |  |  |  |  |  |
| C-3 |  |  | 0.5 |  |  | 0.2 | 0.1 |  |  |  |  |  |
| C-4 |  |  |  |  |  |  |  | 0.3 |  |  |  |  |
| C-5 |  |  |  |  |  |  |  |  | 0.1 |  |  |  |
| RC-1 |  |  |  |  |  |  |  |  |  | 0.2 |  |  |
| RC-2 |  |  |  |  |  |  |  |  |  |  | 0.5 |  |
| RC-3 |  |  |  |  |  |  |  |  |  |  |  | 1 |
| D-1 | 2 | 2 | 2 | 2 |  | 2 | 2 | 2 |  | 2 | 2 | 2 |
| D-2 |  |  |  |  | 2 |  |  |  | 2 |  |  |  |
| E-1 | 0.1 | 0.01 | 0.01 | 0.1 | 0.05 | 0.1 | 0.05 | 0.1 | 0.05 | 0.1 | 0.1 | 0.01 |
| F-1 |  | 10 |  |  |  | 20 |  |  |  | 10 |  |  |
| F-2 |  |  | 5 |  | 2 |  |  |  |  |  |  | 5 |
| F-3 | 160 | 160 | 160 | 160 | 160 | 160 | 160 | 160 | 160 | 160 | 160 | 160 |

D-1: compound represented by the following formula (D-1)

D-2: compound represented by the following formula (D-2).

[Chemical Formula 19]

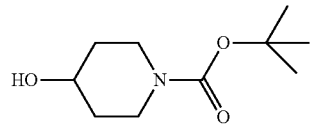

(D-1)

<Production of Resist Pattern Film>

Examples 1B to 9B and Comparative Examples 1B to 3B

Using a spin coater, the photosensitive resin compositions of Examples 1A to 9A and Comparative Examples 1A to 3A were applied onto the copper sputtered film of the silicon wafer substrate provided with the copper sputtered film, and was heated on a hot plate for 60 seconds at 120° C. to form a coating having a film thickness of 6 μm. The above coating was exposed using a stepper (model "NSR-110D" manufactured by Nikon Corporation) via a pattern mask. The exposed coating was heated at 90° C. for 60 seconds and then immersed in a 2.38% by mass of tetramethylammonium hydroxide aqueous solution for 180 seconds to perform development. Thereafter, washing with running water and then blowing with nitrogen provided formation of the resist pattern films of Examples 1B to 9B and Comparative Examples 1B to 3B (line width: 2 μm, line width/space width=1/1) on the copper sputtered film of the substrate. The size of the footing shape of this resist pattern film was observed with an electron microscope. The evaluation results are shown in Table 3. The size of the footing shape means the size of w in FIG. 1.

The substrate with this resist pattern film formed is referred to as "patterning substrate".

<Production of Plated Formed Product>

Examples 1C to 9C and Comparative Examples 1C to 3C

Using the resist pattern film as a mold, the electrolytic plating treatment was performed to produce a plated formed product. As a pretreatment for the electrolytic plating treatment, the treatment with oxygen plasma (output of 100W, oxygen flow rate of 100 ml, treatment time of 60 seconds) was performed, and then washing with water was performed. The pretreated patterning substrate was immersed in 1L of a copper plating solution (product name "MICROFAB SC-40", manufactured by MacDermid Performance Solutions Japan K.K.), and the electroplating treatment was performed at a plating bath temperature of 25° C. and a current density of 8.5 A/dm² for 2 minutes and 10 seconds to produce a plated formed product.

After the production of the plated formed product, using an electron microscope, observed was whether or not the plating solution had penetrated into the interface between the resist pattern film and the copper sputtered film of the silicon wafer substrate. The presence or absence of the penetration of the plating solution was evaluated as "resistance to a plating solution" according to the following evaluation criteria. The evaluation results are shown in Table 3 below.

AA: no penetration of plating solution.
BB: penetration of plating solution.
[Table 3]

REFERENCE SIGNS LIST

10 Substrate
20 Metal film
30 Resist pattern film
32 Footing
w Footing size

The invention claimed is:
1. A photosensitive resin composition, comprising:
a polymer (A) having an acid dissociative group;
a photoacid generator (B);
at least one compound (C) selected from the group consisting of a compound (C2) represented by formula (C2) and a multimer of the compound (C2); and
a quencher (D),

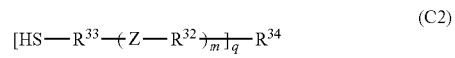

wherein, in formula (C2), each Z independently represents an oxygen atom or a sulfur atom, $R^{32}$ and $R^{33}$ each independently represent a divalent hydrocarbon group, $R^{34}$ represents a glycoluril ring structure or an isocyanul ring structure, m is 1 or 0, and q is an integer of 1 to 4, and wherein an amount of the compound (C) in the photosensitive resin composition is 0.01 to 10 parts by mass with respect to 100 parts by mass of the polymer (A).

2. The photosensitive resin composition according to claim 1, wherein the compound (C) is the compound (C2).

3. The photosensitive resin composition according to claim 1, wherein the compound (C2) is at least one selected from compound (C2-1) represented by formula (C2-1) and compound (C2-2) represented by formula (C2-2),

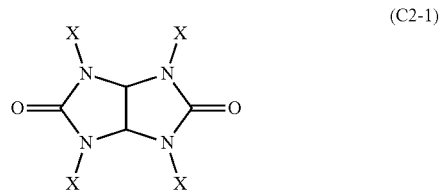

TABLE 3

| Photosensitive resin composition | Production of resist pattern film | Size of footing shape of resist pattern film [μm] | Production of plated formed product | Evaluation of resistance to plating solution |
| --- | --- | --- | --- | --- |
| Example 1A | Example 1B | 0.06 | Example 1C | AA |
| Example 2A | Example 2B | 0.04 | Example 2C | AA |
| Example 3A | Example 3B | 0.01 | Example 3C | AA |
| Example 4A | Example 4B | 0.09 | Example 4C | AA |
| Example 5A | Example 5B | 0.05 | Example 5C | AA |
| Example 6A | Example 6B | 0.02 | Example 6C | AA |
| Example 7A | Example 7B | 0.02 | Example 7C | AA |
| Example 8A | Example 8B | 0.01 | Example 8C | AA |
| Example 9A | Example 9B | 0.02 | Example 9C | AA |
| Comparative Example 1A | Comparative Example 1B | 0.16 | Comparative Example 1C | AA |
| Comparative Example 2A | Comparative Example 2B | 0.19 | Comparative Example 2C | BB |
| Comparative Example 3A | Comparative Example 3B | 0.23 | Comparative Example 3C | AA |

-continued

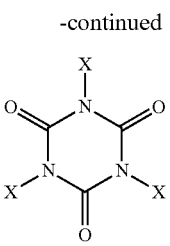

(C2-2)

wherein in formulas (C2-1) and (C2-2), X each independently represents a hydrogen atom or a monovalent group represented by formula (g2), at least one X in formula (C2-1) is a monovalent group represented by formula (g2), and at least one X in formula (C2-2) is a monovalent group represented by formula (g2), $$[HS-R^{33}-(Z-R^{32})_{\overline{m}}]-*$$ (g2)

wherein in formula (g2), Z, $R^{32}$, $R^{33}$, and m are synonymous with Z, $R^{32}$, $R^{33}$, and m in formula (C2), respectively, and * is a bonding hand with a nitrogen atom in formula (C2-1) or formula (C2-2).

4. A method for producing a resist pattern film, the method comprising:
applying the photosensitive resin composition according to claim 1 on a metal film provided on a surface of a substrate to form a resin film on the metal film;
exposing the resin film; and
developing the exposed resin film.

5. A method for producing a plated formed product, the method comprising:
producing a resist pattern film by the method according to claim 4 to obtain a plating substrate which comprises the substrate, the metal film provided on the surface of the substrate, and the resist pattern film formed on the metal film;
performing a plasma treatment with an oxygen-containing gas on the plating substrate; and
performing, after the plasma treatment, a plating treatment on the plating substrate with the resist pattern film as a mold.

6. The photosensitive resin composition according to claim 1, wherein, in formula (C2), m is 1.

7. The photosensitive resin composition according to claim 1, wherein $R^{34}$ represents a glycoluril ring structure.

8. The photosensitive resin composition according to claim 3, wherein the compound (C2) is the compound (C2-1).

9. A photosensitive resin composition, comprising:
a polymer (A) having an acid dissociative group;
a photoacid generator (B); and
a compound (C1) represented by formula (C1),

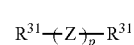

(C1)

wherein, in formula (C1), Z represents a sulfur atom, each $R^{31}$ represents a group obtained by substituting at least one hydrogen atom in a monovalent hydrocarbon group with a mercapto group, and p is an integer of 1, and
wherein an amount of the compound (C1) in the photosensitive resin composition is 0.01 to 0.5 parts by mass with respect to 100 parts by mass of the polymer (A).

10. The photosensitive resin composition according to claim 9, wherein the compound (C1) is represented by formula (C1-2):

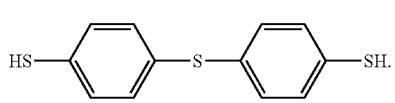

(C1-2)

11. The photosensitive resin composition according to claim 9, further comprising quencher (D).

12. A method for producing a resist pattern film, the method comprising:
applying the photosensitive resin composition according to claim 9 on a metal film provided on a surface of a substrate to form a resin film on the metal film;
exposing the resin film; and
developing the exposed resin film.

13. A method for producing a plated formed product, the method comprising:
producing a resist pattern film by the method according to claim 12 to obtain a plating substrate which comprises the substrate, the metal film provided on the surface of the substrate, and the resist pattern film formed on the metal film;
performing a plasma treatment with an oxygen-containing gas on the plating substrate; and
performing, after the plasma treatment, a plating treatment on the plating substrate with the resist pattern film as a mold.

* * * * *